United States Patent
Top et al.

(10) Patent No.: US 9,740,249 B2
(45) Date of Patent: Aug. 22, 2017

(54) MOUNTING DEVICE

(71) Applicant: Hewlett-Packard Development Company, L.P., Houston, TX (US)

(72) Inventors: Arnold Nicholas Top, Houston, TX (US); Joseph R Allen, Tomball, TX (US); Troy Anthony Della Fiora, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/033,496

(22) PCT Filed: Jan. 30, 2014

(86) PCT No.: PCT/US2014/013806
§ 371 (c)(1),
(2) Date: Apr. 29, 2016

(87) PCT Pub. No.: WO2015/116094
PCT Pub. Date: Aug. 6, 2015

(65) Prior Publication Data
US 2016/0266620 A1    Sep. 15, 2016

(51) Int. Cl.
*G06F 1/18* (2006.01)
*H05K 5/02* (2006.01)
*H01R 12/71* (2011.01)
*H01R 13/629* (2006.01)

(52) U.S. Cl.
CPC .......... *G06F 1/185* (2013.01); *H01R 12/716* (2013.01); *H01R 13/62911* (2013.01); *H01R 13/62922* (2013.01); *H05K 5/0226* (2013.01)

(58) Field of Classification Search
CPC combination set(s) only.
See application file for complete search history.

(56) References Cited

U.S. PATENT DOCUMENTS

| | | | |
|---|---|---|---|
| 5,675,472 A | 10/1997 | Hamerton-Kelly | |
| 6,118,668 A * | 9/2000 | Scholder | G06F 1/184 361/679.32 |
| 6,171,120 B1 | 1/2001 | Bolich | |
| 6,301,099 B1 * | 10/2001 | Felcman | G06F 1/184 312/332.1 |
| 6,315,586 B1 | 11/2001 | Joyce | |
| 6,430,644 B1 * | 8/2002 | Luen | G06F 1/181 361/726 |
| 6,494,729 B1 | 12/2002 | Stathopoulos | |

(Continued)

FOREIGN PATENT DOCUMENTS

JP    2000195643    7/2000

OTHER PUBLICATIONS

PCT/ISA/KR, International Search Report mailed Oct. 24, 2014, PCT/US2014/013806, 10 pps.

*Primary Examiner* — Lisa Lea Edmonds
(74) *Attorney, Agent, or Firm* — Hewlett Packard Enterprise Patent Department (57) ABSTRACT

A mounting device is disclosed. The mounting device has a handle rotatable between an open position and a closed position. The handle has latching features at each end that couple to mating latching features. As the handle is rotated from its open position towards its closed position, the latching features force the handle towards the mating latching features.

15 Claims, 6 Drawing Sheets

(56) References Cited

U.S. PATENT DOCUMENTS

| | | | |
|---|---|---|---|
| 7,292,457 B2 | 11/2007 | DeNies et al. | |
| 7,381,074 B1* | 6/2008 | Bridges | G06F 1/185 |
| | | | 439/325 |
| 7,390,194 B1 | 6/2008 | Crippen et al. | |
| 7,465,175 B2* | 12/2008 | Crippa | H01R 12/716 |
| | | | 439/157 |
| 7,535,730 B2* | 5/2009 | Junkins | H05K 7/1418 |
| | | | 29/832 |
| 7,589,974 B2 | 9/2009 | Grady et al. | |
| 7,623,357 B2 | 11/2009 | Wallace | |
| 7,649,751 B2 | 1/2010 | Nguyen et al. | |
| 7,746,665 B2* | 6/2010 | Junkins | H05K 7/1418 |
| | | | 361/756 |
| 8,089,770 B2* | 1/2012 | Olesiewicz | G06F 1/185 |
| | | | 361/752 |
| 8,366,464 B1 | 2/2013 | Figuerado et al. | |
| 8,391,022 B2 | 3/2013 | Olesiewicz et al. | |
| 8,432,684 B2* | 4/2013 | Wu | G06F 1/185 |
| | | | 361/679.41 |
| 8,472,178 B2* | 6/2013 | Hartman | G06F 1/183 |
| | | | 361/679.01 |
| 8,559,170 B2* | 10/2013 | Lee | G06F 1/185 |
| | | | 361/679.32 |
| 9,048,592 B2* | 6/2015 | Chen | H01R 12/71 |
| 2005/0190546 A1 | 9/2005 | Chen | |
| 2006/0160394 A1 | 7/2006 | Korsunsky | |
| 2007/0105425 A1 | 5/2007 | Wang | |
| 2007/0127225 A1 | 6/2007 | Slaton | |
| 2007/0281500 A1 | 12/2007 | Wang | |
| 2012/0257360 A1* | 10/2012 | Sun | H01R 12/7052 |
| | | | 361/748 |
| 2014/0098480 A1* | 4/2014 | Foster, Sr. | G06F 1/185 |
| | | | 361/679.31 |
| 2014/0187059 A1* | 7/2014 | Takemoto | H01R 12/716 |
| | | | 439/65 |
| 2015/0064942 A1* | 3/2015 | Takemoto | H01R 12/7029 |
| | | | 439/74 |

* cited by examiner

MOUNTING DEVICE

BACKGROUND

Servers are typically rack mounted computer devices deployed in a data center. The servers typically have may different configurations or options. Some of the different configurations require that a specific daughter card is installed onto the main printed circuit (PC) board. To change the configuration or upgrade to a new configuration, a new daughter card may be installed onto the main PC board. The daughter card can typically be installed onto the main PC board in the field without having to return the server to the factory.

DETAILED DESCRIPTION

Replacing or installing a daughter card onto the main PC board in a server can be difficult. Typically the main PC board is installed into the bottom of a drawer that slides into a rack. The main PC hoard is typically parallel with the bottom surface of the drawer with multiple connectors mounted on the top side of the PC board. The daughter card has the mating connectors mounted on its bottom side and is installed parallel with the main PC board. Because the daughter card is installed parallel with the main PC board and the mating connectors are on the bottom side of the daughter card, the daughter card blocks the view of the connectors. Therefore it is difficult to align the connectors so they can be mated together. When the connectors are not properly aligned during the mating process the connectors can be damaged.

Another problem when installing the daughter card is that the force required to mate the different connectors together can be high. Pushing on the daughter card to mate the connectors together can bend or crack the daughter card or damage components mounted to the top side of the daughter card. In addition the force required to mate the multiple connectors may be different. Because the force required to insert one connector into its mate may be different than the force required to insert another connector into its mate, it may be difficult to keep the daughter card parallel with the main PC board during installation. When the daughter card becomes tilted the connectors may bind or become damaged.

Another problem when installing a daughter card into the main PC board is that the service technician may not have the required tools to remove or install a daughter card. Some daughter cards are secured to the main PC board with screws once they have been installed. The screws require that the service technician have the proper tool to secure the daughter card. In addition the screws increase the cost of the daughter card and can be misplaced or lost during installation and removal.

In one example, the main PC board will have spring loaded telescopic guide pins that will guide the connectors on the daughter card into the mating connectors on the main PC board. The guide pins can move between an extended position and a collapsed position. In the extended position, the guide pins will extend above the main PC board such that the daughter card can be mated to the guide pins before the connectors on the daughter card contact the mating connectors on the main PC board. Once the daughter card is coupled to the guide pins the daughter card can be lowered/guided onto the main PC board with the guide pins aligning the connectors on the daughter card to the mating connectors on the main PC board.

As the daughter card is lowered towards the main PC board the guide pins collapse from their extended position into their collapsed position. Because the tops of the guide pins move down with the daughter card, the area above the daughter card remains available for other devices, for example a cover, once the daughter card is installed into the main PC hoard.

In one example the daughter card will have a spring loaded handle attached to the top side of the daughter card. The handle will rotate between an open position and a closed and latched position. In one example, the handle will be substantially perpendicular to the top side of the daughter card when it is in the open position. The spring will hold the handle in the open position. In the closed position the handle will be substantially parallel with, and flat against, the top surface of the daughter card.

In another example, the handle will make an angle less than 90 degrees with the top side of the daughter card when in the open position. In this example the handle may make an angle between 15 degrees and 85 degrees with the surface of the daughter card, for example 45 degrees, when in the open position. When the handle is not perpendicular to the top side of the daughter card when it is in the open position there is less side force and more downward force when the handle is rotated from the open position towards the closed position. The spring will hold the handle in the open position.

As the handle is rotated from the open position towards the closed position, a latching feature on the two ends of the handle will grab mating latching features on the main PC board and pull the daughter card down onto the main PC board. As the handle is moved into the closed position it will be latched in place thereby securing the daughter card onto the main PC board. The handle can be unlatched without any tools, allowing the daughter card to be installed and removed without tools.

Figure 1:
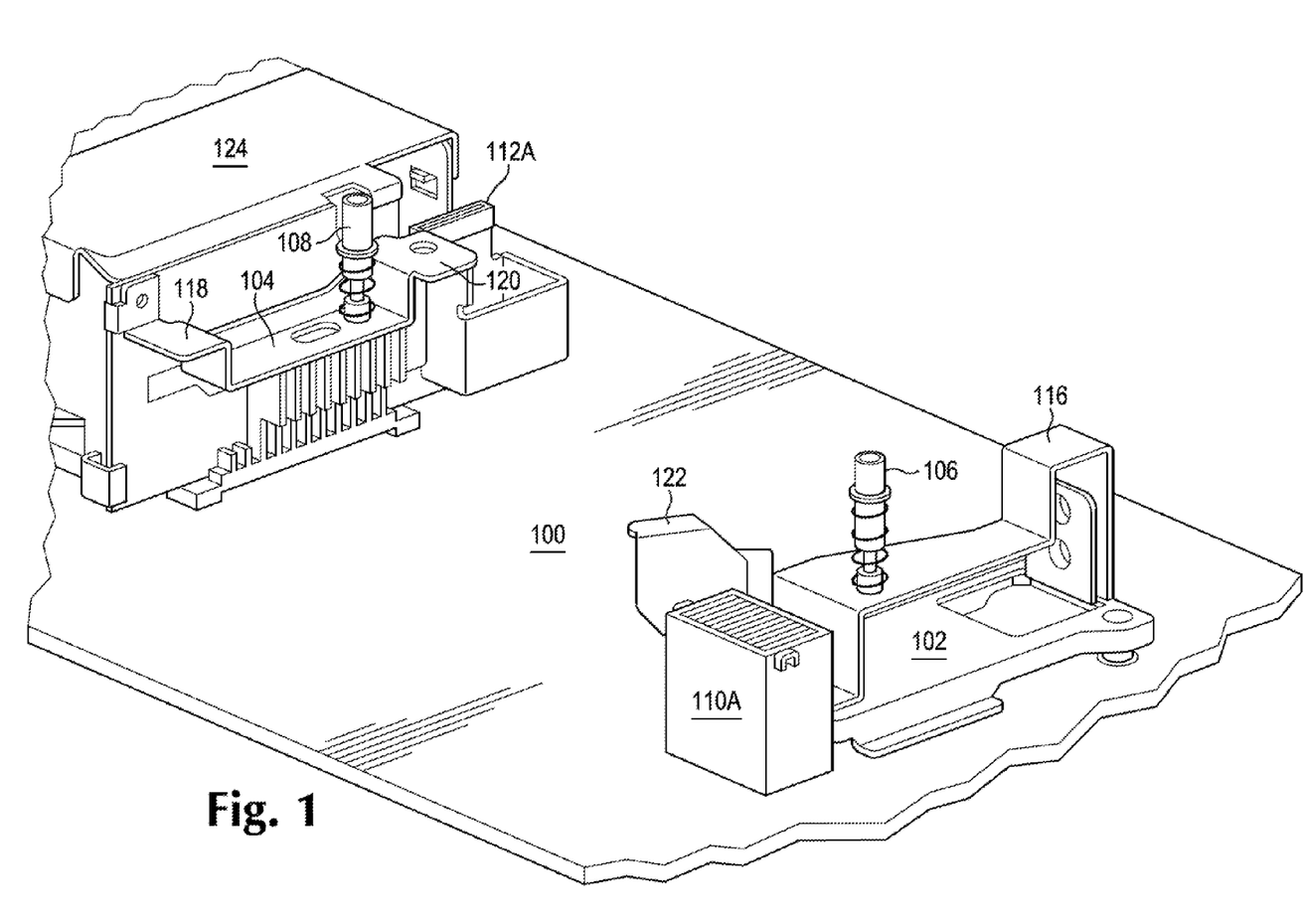
FIG. 1 is an isometric partial view of an example main PC board 100.

FIG. 1 is an isometric partial view of an example main PC board 100. Main PC board 100 has a number of components loaded on its top surface including: two connectors 110A and 112A, two mounting brackets 102 and 104 and component 124. The two mounting brackets (102 and 104) each comprise a spring loaded telescopic guide pin 106 and 108, a landing ledge 116 and 118 and a latching feature. The latching feature comprising a push-off surface 120 and 122 and a latching surface (see FIGS. 5A-5C) underneath the push-off surfaces (120 and 122).

The two mounting brackets 102 and 104 are positioned at opposite ends of a generally rectangular area on the main PC board where the daughter card will be mounted. Other component may be mounted on the top surface of main PC board 100, for example component 124. Component 124 is mounted on the top surface of the main PC board beyond the area where the daughter board will be mounted. The two connectors (110A and 112A) are mounted to the top surface of the main PC board in diagonally opposite corners of the generally rectangular area on the main PC board where the daughter board will be mounted, with one connector located on one side of each of the two mounting brackets (102 and 104).

Figure 5A:
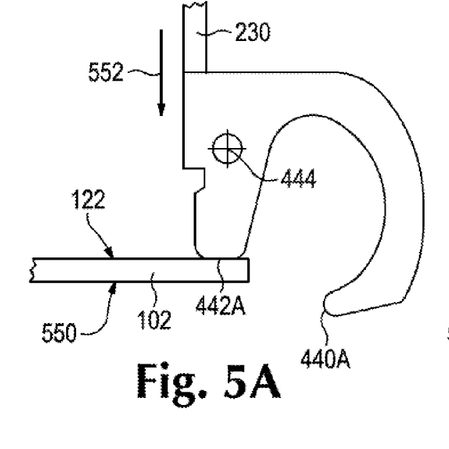
FIG. 5A-5C are partial side views of one end of an example handle 230 during installation of a daughter card into a main PC board.

The push-off surface and latching surface on each of the two mounting brackets (102 and 104) are located adjacent to the two connectors. The latching surface is underneath the push-off surface (see FIG. 5). The landing ledge 116 and 118 on each mounting bracket is located on the opposite side of the mounting bracket from the push-off surface and latching surface. The two landing ledges (116 and 118) and the two push-off surfaces (120 and 122) form a plane parallel with the top surface of the main PC board 100. A spring loaded guide pin is mounted onto each of the two mounting brackets (102 and 104). The spring loaded guide pins can move between an extended position and a collapsed position. The spring loaded guide pins are shown in their extended positions.

When a daughter card is to be installed onto main PC board 100, holes in the daughter card will be aligned with the spring loaded guide pins. In one example the holes are through holes. In another example the holes are blind holes on the bottom side of the daughter card. Once the guide pins are inserted into the holes in the daughter card, the daughter card can be lowered/guided towards the main PC board until the mating latching features on each end of the handle engage with the latching features on the mounting brackets (102 and 104). In this example the mating latching features on each end of the handle are cams and hooks (see FIG. 4). Once the cams on the handle engage with the push-off surfaces on the mounting brackets (102 and 104), the handle can be rotated from its open position angled away from the daughter card 200 into its closed position where the handle is substantially parallel with, and flat against the daughter card 200.

Figure 2:
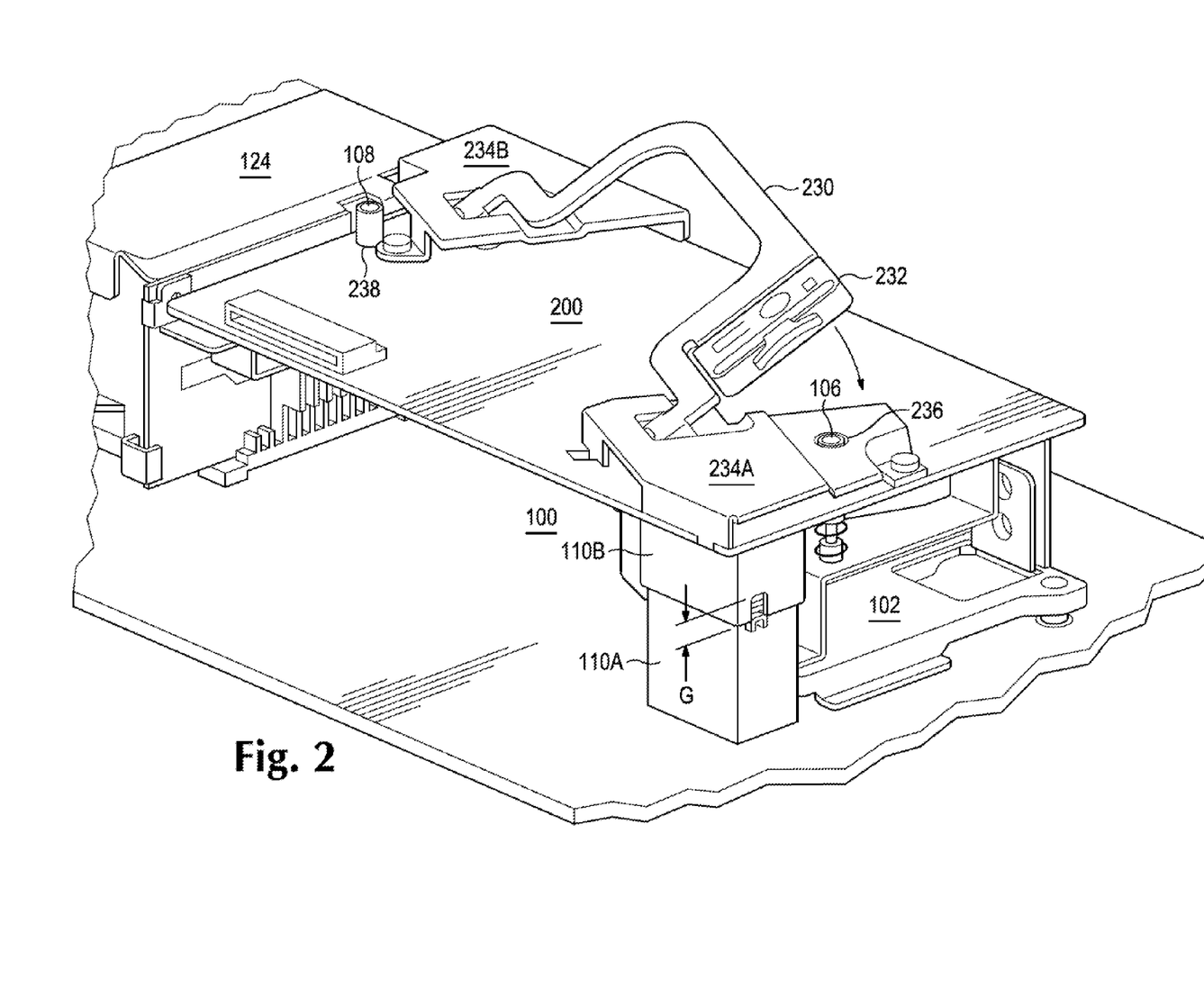
FIG. 2 is an isometric view of an example daughter card 200 being installed into the main PC hoard 100 of FIG. 1.

FIG. 2 is an isometric view of an example daughter card 200 being installed into the main PC board 100 of FIG. 1. Daughter card 200 comprises two mating connectors 110B and 112B (connector 112B is not visible in this view), a handle 230, a handle spring and handle mounting brackets 234A and 234B. The two handle mounting brackets 234A and 234B are attached to the top surface of the daughter card 200 in diagonally opposite corners of the generally rectangular daughter card 200. The handle 230 is mounted between the two handle mounting brackets 234A and 234B and can rotate between an open position and a closed position. In the open position the handle is angled away from the top surface of the daughter card 200. In the closed position the handle is substantially parallel with, and flat against, the top surface of the daughter card 200. The handle spring (not shown) forces the handle 230 towards the open position.

Daughter card 200 is shown almost, but not quite, fully inserted onto the main PC board 100. Connector 110B is shown engaged with, but not fully inserted into its mating connector 110A. A gap G shows the distance remaining before the daughter card 200 is fully inserted into the main PC board 100. The two spring loaded guide pins (106 and 108) are shown inserted into two holes (236 and 238) in the daughter card 200. Handle 230 is shown partially rotated between the open position and the closed and latched position.

As the handle is rotated from its open position into the closed position, hooks on each end of the handle grab the latching surfaces on the mounting brackets (102 and 104) and pull the daughter card 200 towards the main PC board 100. Once the handle 230 is rotated into its closed and latched position, where the handle is substantially parallel with, and flat against the daughter card 200, the daughter card 200 will be fully inserted and secured onto the main PC board 100.

A handle latch 232 is attached to one side of the handle. Handle latch 232 has a cantilevered protrusion (see FIG. 6) that snaps underneath part of handle mounting brackets 234A when the handle reaches its closed position. The handle latch holds the handle in the closed position against the force of the handle spring once the protrusion snaps underneath part of handle mounting brackets 234A. In other examples, the handle latch may be located in a different place, for example attached to the handle mounting bracket or to the daughter card. In this example, the handle latch engages the handle instead of engaging the handle mounting bracket.

Figure 3:
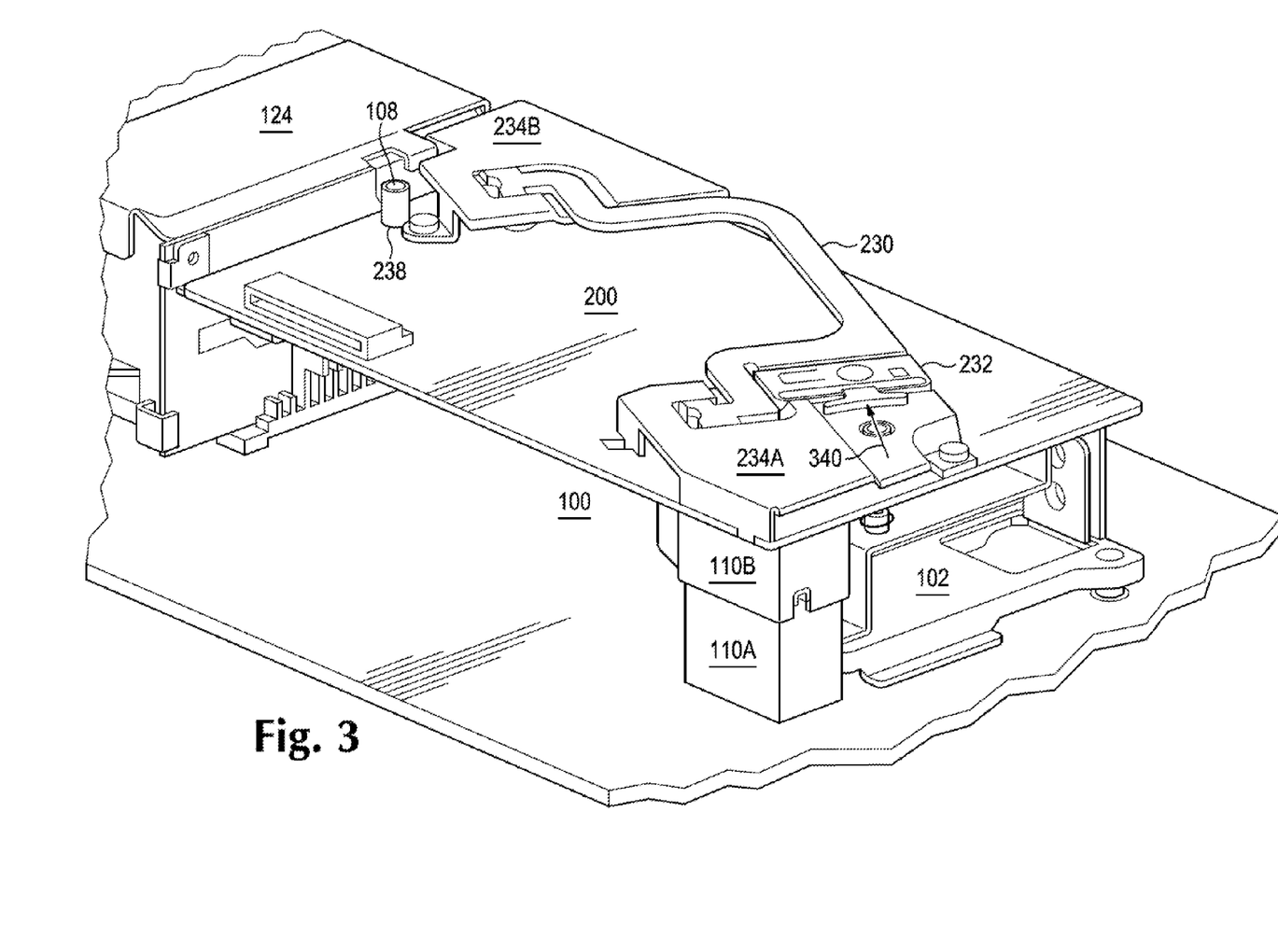
FIG. 3 is an isometric view of an example daughter card 200 installed into the main PC board 100 of FIG. 1.

FIG. 3 is an isometric view of an example daughter card 200 installed into the main PC board 100 of FIG. 1. Handle 230 is in its closed and latched position where the handle is substantially parallel with, and flat against the daughter card 200. When the handle 230 is in its closed and latched position, the top side of the handle is flush with, or below, the top surface of the two mounting brackets 234A and 234B. The two guide pins (108 and 106) are in their collapsed position. In the collapsed position the top surface of the two guide pin (106 and 108) are flush with, or below, the top surface of mounting brackets 234A and 234B.

Handle 230 can be unlocked from mounting bracket 234A by pushing against handle latch 232 in the location shown by arrow 340. Once the handle latch 232 is disengaged with the mounting bracket 234A, the handle spring will force the handle upward into a slightly opened position. The handle 230 can then be rotated towards the open position. As the handle 230 is rotated towards the open position, cams (442A & B) on each end of the handle (See FIG. 4) push against the push-off surfaces (120 and 122) on each mounting bracket (234A and 234B) forcing the daughter card 200 away from the main PC board 100. As the daughter card is moved away from the main PC board 100, the two pairs of connectors (110A and 110B) and (112A and 112B) are pulled apart.

Figure 4:
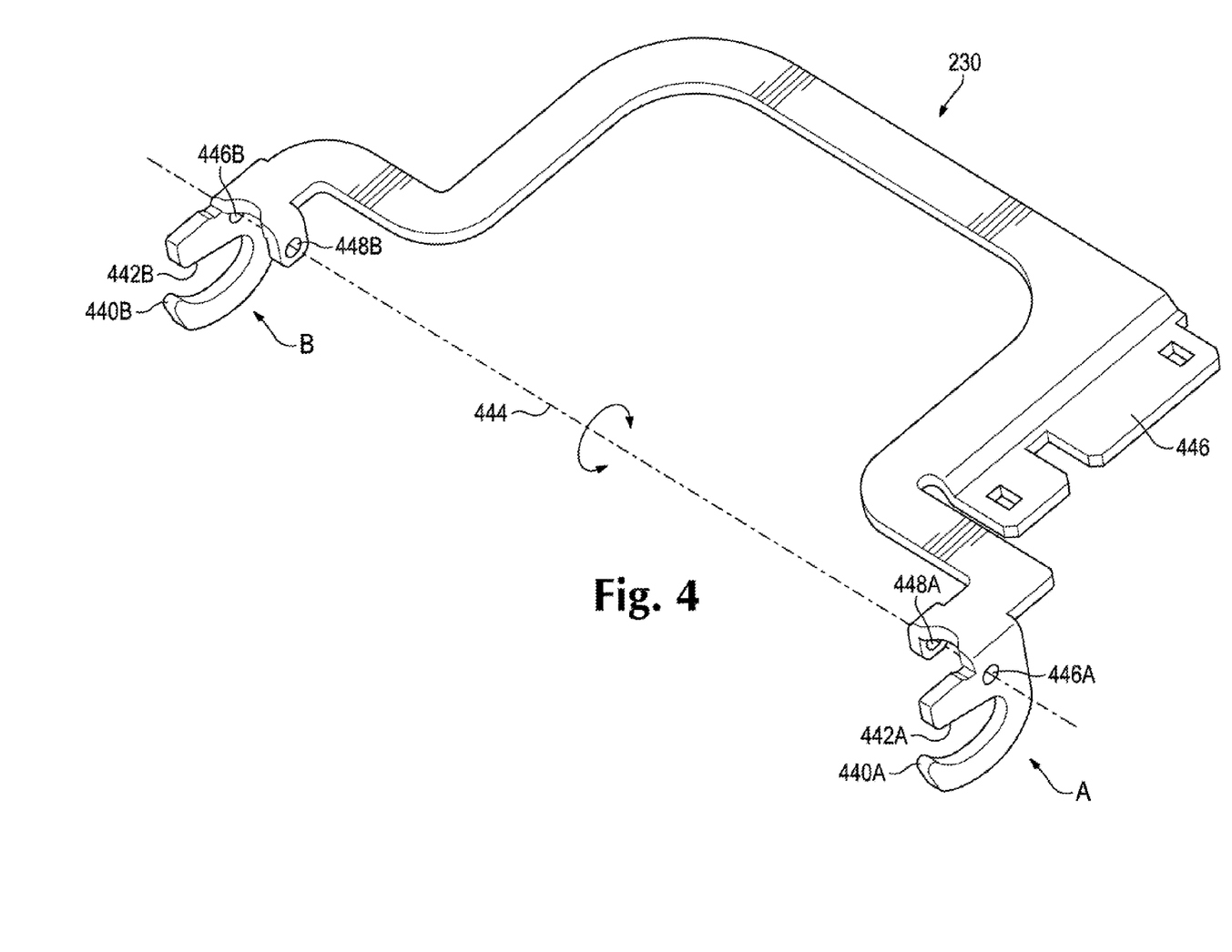
FIG. 4 is an isometric view of an example handle 230.

FIG. 4 is an isometric view of an example handle 230. Handle 230 is generally U shaped with two ends (end A and end B). Each end (A and B) of the handle 230 has two holes that mate with locking pins (not shown) that retain the handle into the two mounting brackets (234A and 234B). The 4 holes (446A & B and 448A & B) form an axis of rotation 444 that the handle 230 rotates about. A mount 446 for the handle latch 232 is formed on one side of the handle 230.

Each end of the handle has a latching feature. In this example the latching feature is a hook (440A & B) and a cam (442A & B). The hooks and cams extend below the bottom surface of the daughter card 200, through opening in the daughter card 200, when the handle is installed into mounting brackets (234A & B). When the handle is rotated from the open position towards the closed position, the tips of the hooks (440A & B) push against the latching surfaces on the two mounting brackets (234A & B) thereby forcing the daughter card towards the main PC board. When the handle is rotated from the closed position towards the open position, the cams (442A & B) push against the push-off surfaces on the two mounting brackets (234A & B) thereby forcing the daughter card away from the main PC board.

Figure 5B:
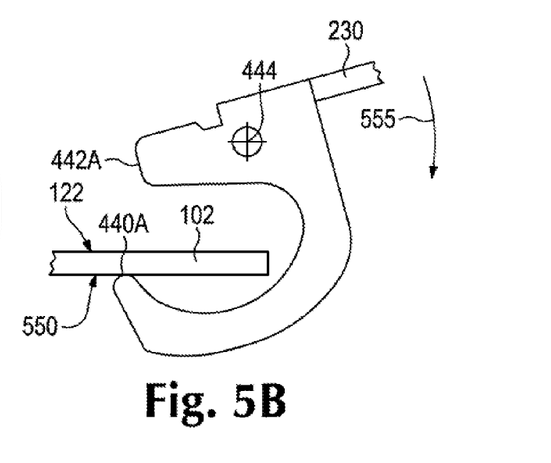
Figures 5C, 5D, 5E, 5F:
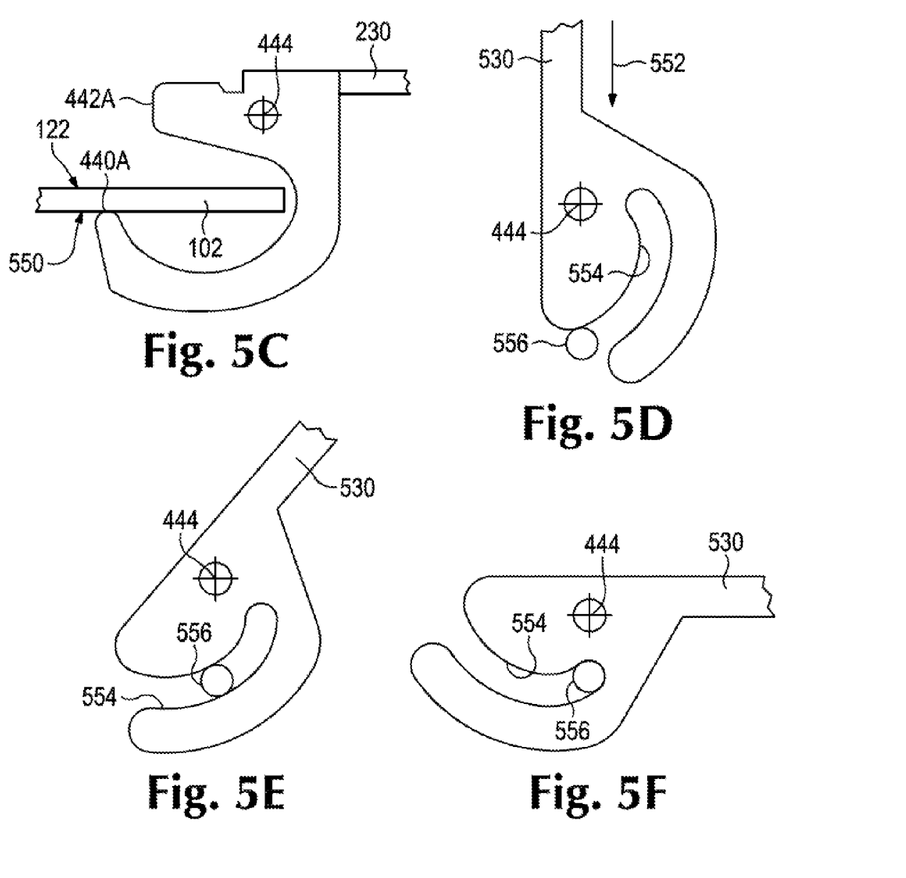
FIG. 5D-5F are partial side views of one end of another example handle 530 during installation of a. daughter card into a main PC board

FIGS. 5A-5C are partial side views of one end of an example handle 230 during installation of a daughter card into a main PC board. The daughter card 200 and main PC board 100 are not shown in these views for clarity but would be in a horizontal orientation in all three views (5A-5C). In one example the handle is in the open position when it is perpendicular to the top surface of the daughter card as shown in view 5A. In another example the handle is in the open position when it makes an angle less than 90 degrees with respect to the top surface of the daughter card, for example 60 degrees. The handle end has a hook 440A and a cam 442A and an axis of rotation 444. As the handle is lowered towards the mounting bracket 102 (as shown by arrow 552) the cam will contact the push-off surface 122 on the top face of the mounting bracket 102. In this position the guide pins (106 and 108) are already engaged with the holes in the daughter card 200.

FIG. 5B shows the handle after the handle has been rotated (as shown by arrow 555) about axis 444 towards the closed position. As the handle is rotated about axis 444 the hook 440A is forced against the latching surface 550 on the bottom face of mounting bracket 102 underneath the push-off surface. As the handle continues to rotate the daughter card 200 is forced down onto the main PC board 100. FIG. 5C shows the handle after the handle has been rotated (as shown by arrow 555) about axis 444 into the closed position. When the handle is in the closed position the daughter card is held against the two landing ledges (116 and 118) and the two push-off surfaces (120 and 122).

To remove the daughter card from the main PC board the handle is unlatched and rotated in the opposite direction from arrow 555. When the handle 230 is rotated in the opposite direction (from the closed position towards the open position) the cam 442A is forced against push-off surface 122 on the top face of mounting bracket 102, forcing the daughter card 200 away from the main PC board 100.

The handle 120 stretches diagonally across the generally rectangular daughter card 200 (see FIGS. 2 and 3) with one end near opposite corners of the daughter card 200. Because both ends of the handle rotate at the same rate, the displacement of the daughter card, either towards or away from the main PC board, is the same for each corner of the daughter card 200. This keeps the daughter card 200 parallel with the main PC board dining installation and removal. In other examples the connectors on the main PC board and the mating connectors on the daughter card may be located between the two edges of the daughter card (instead of in a corner). The handle would then be parallel with the edges of the daughter card with each end near one of the connectors.

Because the two ends of the handle are connected together, the force to insert the two connectors into their mating parts is balance between each end of the handle. In some examples the two connectors (110A and 112A) are the same type of connectors and require the same amount of insertion force. In other examples the two connectors are different types of connectors (as shown) and the insertion force is different between the two connectors.

FIGS. 5A-5C show the latching feature on the end of the handle as cams and hooks. The cam and hook on the ends of the handle engage with the top and bottom surfaces of a flat plate. In another example, the latching feature on each end of the handle may be a slot that engages with a pin on the mounting bracket. FIGS. 5D-5F are partial side views of one end of another example handle 530 during installation of a daughter card into a main PC board. The daughter card 200 and main PC board 100 are not shown in these views for clarity but would be in a horizontal orientation in all three views (5D-5F). In one example the handle is in the open position when it is perpendicular to the top surface of the daughter card as shown in view 5D. In another example the handle is in the open position when it makes an angle less than 90 degrees with respect to the top surface of the daughter card, for example 45 degrees. The handle end has a slot 554 and an axis of rotation 444. As the handle is lowered towards the pin 556 (as shown by arrow 552) the top side of the slot 554 will contact the pin 556. In this position the guide pins (106 and 108) are already engaged with the holes in the daughter card 200.

FIG. 5E shows the handle after the handle has been rotated about axis 444 towards the closed position. As the handle is rotated about axis 414 the slot 554 engages with the pin 556. As the handle continues to rotate the daughter card 200 is forced down onto the main PC board 100. FIG. 5F shows the handle after the handle has been rotated about axis 444 into the closed position. When the handle is in the closed position the daughter card is held against the two landing ledges (116 and 118).

To remove the daughter card from the main PC board the handle is unlatched and rotated in the opposite direction. When the handle 520 is rotated in the opposite direction (from the closed position towards the open position) the pin 556 is forced against the slot 554, forcing the daughter card 200 away from the main PC board 100.

Figure 6:
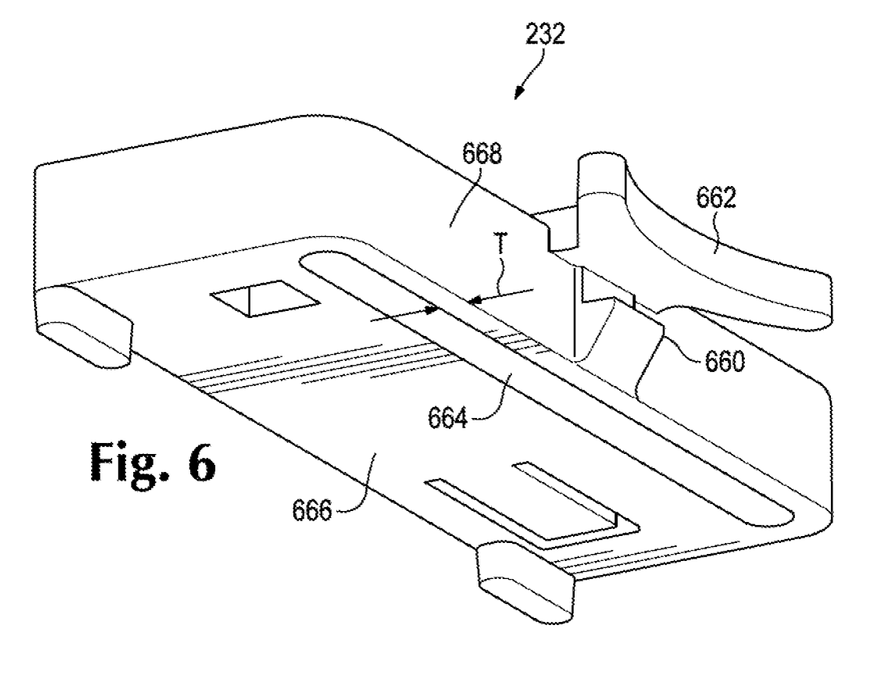
FIG. 6 is an isometric bottom view of an example handle latch 232.

FIG. 6 is an isometric bottom view of an example handle latch 232. Handle latch 232 comprises a main body 666, a protrusion 660, a thin section 668 and a thumb rest 662. Handle latch 232 is fabricated from a material that has some amount of flex, for example plastic. Handle latch has a main body 666. A thin section 558 is attached to the main body 666 at each end of the thin section 668 forming a gap or opening 664 between the main body 666 and the thin section 668. The protrusion 660 is formed on one side of the thin section 660 opposite the opening 664. The thumb rest 662 is formed on the thin section above the protrusion 660. The thin section 668 can be deflected towards the gap or opening by pressing against the thumb rest 662. In another example, the handle latch may be a ramped shuttle and spring design instead of the flexing beam design shown in FIG. 6.

In operation the handle latch 232 is attached to one side of the handle (see FIGS. 2 and 3). The protrusion 660 snaps over an edge of the handle mounting bracket 234A as the handle is rotated into the closed position. To release the handle the thumb rest 662 can be forced towards the gap or opening 664. A handle spring pushes the handle towards the open position, so once the handle latch 232 has been disengaged from the handle mounting bracket 234A, the handle moves away from the top surface of the daughter card (see FIG. 2). Other latch designs may be used to hold the handle in the closed position.

Figure 7:
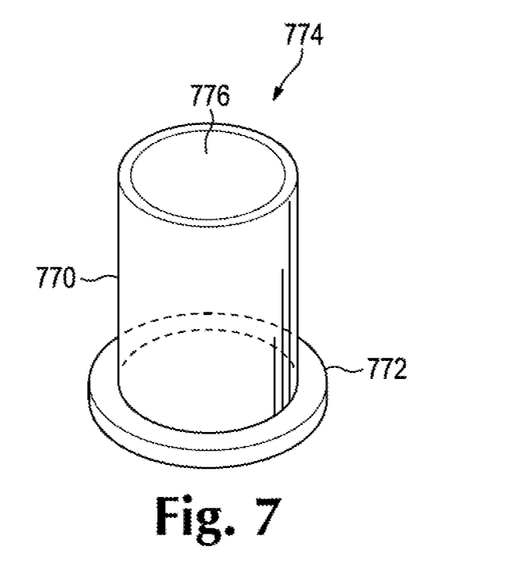
FIG. 7 is an isometric side view of an example guide pin top 774.

FIG. 7 is an isometric side view of an example guide pin top 774. Guide pin top comprises a hollow cylindrical main body 770 and a lip 772. The main body 770 is capped with a solid lid 776. Lip 772 extends around the bottom of main body 770. The diameter of the main body is sized to fit into an opening in the daughter card 200. The lip 772 is sized larger than the hole in the daughter card 200 and acts as a stop to prevent the daughter card from sliding down past the lip 772. The lip causes the guide pin 106 (see FIG. 1) to move from the extended position into the collapsed position as the daughter card is lowered towards the main PC board 100. In operation the guide pin top 774 is spring loaded onto a telescopic guide pin 106.

In some examples the two guide pins (106 and 108) may be identical. In other examples the two guide pins (106 and 108) may be different. For example one guide pin may have a larger diameter that mates with a larger hole in the daughter card. In this way the daughter card may only be inserted onto the guide pins in one orientation. In another example, one guide pin may be longer that the other guide pin to compensate for different mounting surface heights on the two mounting brackets (102 and 104). In the examples described above the telescopic guide pins were attached to the mounting brackets on the main PC board. In other examples the telescopic guide pins are attached to the bottom side of the daughter card.

The mounting device describe above is not limited to a server, but can be used on any computer systems that mount secondary boards onto a main PC board. Some non-limiting examples are: a controller mounting onto a storage main PC board, a memory card mounting onto a processor board and the like.

What is claimed is:

1. A mounting device, comprising:
    a generally rectangular daughter card having a top side, a bottom side, a first end and a second end opposite the first end;
    a first connecter mounted near the first end on the bottom side;
    a second connector mounted near the second end on the bottom side;
    a handle mounted on the top side, the handle rotatable between an open position and a closed position, the handle making an angle with the top side when in the open position and substantially parallel with the top side when in the closed position;
    the handle having a first end and a second end that extend through the daughter card, where the first end is near the first connector and the second end is near the second connector;
    two latching features, one latching feature on each end of the handle, the latching features to act against two mating latching features mounted on a main PC board when the handle is rotated from the open position to the closed position thereby pulling the daughter card towards the main PC board and inserting the two connectors into mating connectors mounted on the main PC board.

2. The mounting device of claim 1, wherein the latching feature on each end of the handle is a hook and the mating latching feature mounted on the main PC board is a latching surface, and where each hook is to push against the latching surface when the handle is rotated from the open position to the closed position.

3. The mounting device of claim 2, further comprising:
    two cams, one cam on each end of the handle, the cams to push against two push-off surfaces mounted on the main PC board when the handle is rotated from the closed position into the open position, thereby moving the daughter card away from the main PC board and separating the two connectors from the mating connectors on the main PC board.

4. The mounting device of claim 1, wherein the latching feature on each end of the handle is a slot and the mating latching feature mounted on the main PC board is a pin, and where each slot is to act against the pin when the handle is rotated from the open position to the closed position.

5. The mounting device of claim 1, further comprising:
    a spring coupled to the handle and acting to force the handle into its open position.

6. The mounting device of claim 1, further comprising:
    as handle latch, the handle latch to latch the handle in place when the handle is moved into the closed position.

7. The mounting device of claim 1, wherein the first connector is a connector of a first type and the second connector is a connector of a second type, different than the first type.

8. The mounting device of claim 1, wherein the daughter card forms two holes, the two holes to mate with two spring loaded telescopic guide pins mounted on the main PC board;
    the two spring loaded telescopic guide pins having an extended position and a collapsed position;
    wherein when the two holes in the daughter card are fully inserted into the two spring loaded telescopic guide pins and the two spring loaded telescopic guide pins are in the extended position the two connectors on the daughter card do not contact the mating connectors on the main PC board.

9. The mounting device of claim 8, further comprising:
    two handle mounting brackets attached to the top side of the daughter card, one of the two handle mounting brackets coupled to each one of two sides of the handle; and
    where a top surface of each of the two spring loaded telescopic guide pins is below a top surface of the handle mounting brackets when the two holes in the daughter card are fully inserted into the two spring loaded telescopic guide pins and the two spring loaded telescopic guide pins are in the collapsed position.

10. A mounting device on a main PC board, comprising:
    a generally rectangular area on a top side where a daughter card can be installed, the generally rectangular area having a first end and a second end, opposite the first end;
    a first connecter mounted on the top side near the first end;
    a second connector mounted on the top side near the second end;
    as first mounting bracket mounted adjacent the first connector;
    a second mounting bracket mounted adjacent the second connector;
    each mounting bracket having a latching feature;
    the two latching features to mate with two mating latching features on each end of a handle mounted to the daughter card, the latching features to act against the two mating latching features when the handle is rotated from an open position to a closed position thereby pulling the daughter card towards the main PC board and inserting two mating connectors, mounted on a bottom side of the daughter card, into the connectors mounted on the main PC board.

11. The mounting device of claim 10, wherein the first connector is a connector of a first type and the second connector is a connector of a second type, different than the first type.

12. The mounting device of claim 10, further comprising:
    two spring loaded telescopic guide pins, where one of the two spring loaded telescopic guide pins is mounted on each of the two mounting brackets, the two spring loaded telescopic guide pins having an extended position and a collapsed position;
    wherein when the two spring loaded telescopic guide pins are hilly mated with the daughter card and the two spring loaded telescopic guide pins are in the extended position, two mating connectors on the daughter card do not contact the connectors on the main PC board.

13. The mounting device of claim 12, wherein a guide pin top on one of the two spring loaded telescopic guide pins has a different diameter than a guide pin top on the other spring loaded telescopic guide pin.

14. A computing device, comprising:
a main PC board mounted in the computing device;
a generally rectangular area on a top side of the main PC board, the generally rectangular area having a first end and a second end, opposite the first end;
a first connecter mounted on the top side near the first end;
a second connector mounted on the top side near the second end;
a first mounting bracket mounted adjacent the first connector;
a second mounting bracket mounted adjacent the second connector;
each mounting bracket having a latching surface on a bottom face of the mounting bracket and a push-off surface on a top face of the mounting bracket, where the latching surface is underneath the push-off surface;
the two latching surfaces mated with two hooks on each end of a handle mounted to a top side of a daughter card installed in the generally rectangular area on top of the main PC board;
the handle rotatable between an open position and a closed position, the handle making an angle with a top side of the daughter card when in the open position and substantially parallel with the top side of the daughter card when in the closed position;
the daughter card having two mating connectors mounted to a bottom side, the two mating connectors inserted into the two connectors on the main PC board.

15. The computer device of claim 14, further comprising:
a landing surface on each of the two mounting brackets, where the two landing surfaces and the two push-off surfaces define a plane substantially parallel with the top surface of the main PC board; and
where the daughter card is held against the two landing surfaces and the two push-off surfaces by the two hooks.

* * * * *